US 6,674,672 B2

(12) United States Patent
Forbes et al.

(10) Patent No.: US 6,674,672 B2
(45) Date of Patent: *Jan. 6, 2004

(54) THRESHOLD VOLTAGE COMPENSATION CIRCUITS FOR LOW VOLTAGE AND LOW POWER CMOS INTEGRATED CIRCUITS

(75) Inventors: Leonard Forbes, Corvallis, OR (US); Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/942,284

(22) Filed: Aug. 27, 2001

(65) Prior Publication Data

US 2002/0031028 A1 Mar. 14, 2002

Related U.S. Application Data

(62) Division of application No. 09/626,214, filed on Jul. 26, 2000, which is a continuation of application No. 09/031,976, filed on Feb. 26, 1998, now Pat. No. 6,097,242.

(51) Int. Cl.$^7$ .............................. G11C 7/00; G11C 7/02
(52) U.S. Cl. ................... 365/189.09; 365/207
(58) Field of Search ............... 365/190, 250, 365/207, 208, 189.09

(56) References Cited

U.S. PATENT DOCUMENTS

| 3,657,575 | A | 4/1972 | Taniguchi et al. ......... 307/304 |
|---|---|---|---|
| 3,806,741 | A | 4/1974 | Smith ........................ 307/304 |
| 4,740,826 | A | 4/1988 | Chatterjee ................... 357/42 |
| 4,761,385 | A | 8/1988 | Pfiester ....................... 437/52 |
| 5,140,388 | A | 8/1992 | Bartelink .................. 357/23.4 |
| 5,227,697 | A | 7/1993 | Sakagami ................... 365/203 |
| 5,292,676 | A | 3/1994 | Manning .................... 437/46 |
| 5,379,255 | A | 1/1995 | Shah .......................... 365/185 |
| 5,382,540 | A | 1/1995 | Sharma et al. ............... 437/52 |
| 5,385,854 | A | 1/1995 | Batra et al. .................. 437/41 |
| 5,396,452 | A | 3/1995 | Wahlstrom ................. 365/149 |
| 5,412,605 | A | * 5/1995 | Ooishi ....................... 365/208 |

(List continued on next page.)

FOREIGN PATENT DOCUMENTS

| JP | 61-140170 | 6/1986 | ........... H01L/27/10 |
|---|---|---|---|
| JP | 63-066963 | 3/1988 | ........... H01L/27/10 |
| JP | 522661 | 9/1993 | ......... H01L/29/784 |

OTHER PUBLICATIONS

Asai, S., et al., "Technology Challenges for Integration Near and Below 0.1 micrometer", *Proceedings of the IEEE*, 85(4), Special Issue on Nanometer–Scale Science & Technology, 505–520, (Apr. 1997).

Askin, H.O., et al., "Fet Device Parameters Compensation Circuit", *IBM Technical Disclosure Bulletin*, 14, 2088–2089, (Dec. 1971).

(List continued on next page.)

*Primary Examiner*—Trong Phan
(74) *Attorney, Agent, or Firm*—Schwegman, Lundberg, Woessner & Kluth, P.A.

(57) ABSTRACT

A compensation circuit for transistor threshold voltages in integrated circuits is described. The compensation circuit includes a transistor, current source, and gate reference voltage supply. The transistor is biased to provide a well bias voltage, or backgate voltage $V_{BG}$, which is coupled to transistors provided on a common integrated circuit. This compensation circuit eliminates the need for gate biasing capacitors, and provides flexibility in setting threshold voltages in low voltage circuits. The gate reference voltage and current source are established to provide a desired backgate voltage $V_{BG}$. Compensation circuits are described for both n-channel and p-channel transistors. A memory device is described which includes compensation circuits for controlling threshold voltages of transistors provided therein.

41 Claims, 5 Drawing Sheets

U.S. PATENT DOCUMENTS

| | | | |
|---|---|---|---|
| 5,443,992 A | 8/1995 | Risch et al. | 437/29 |
| 5,451,889 A | 9/1995 | Heim et al. | 326/81 |
| 5,502,629 A | 3/1996 | Ito et al. | 363/60 |
| 5,646,900 A | 7/1997 | Tsukude et al. | 365/205 |
| 5,707,885 A | 1/1998 | Lim | 437/52 |
| 5,780,888 A | 7/1998 | Maeda et al. | 257/302 |
| 5,789,967 A | 8/1998 | Katoh | 327/408 |
| 5,818,084 A | 10/1998 | Williams et al. | 257/329 |
| 5,821,796 A | 10/1998 | Yaklin et al. | 327/313 |
| 5,831,895 A * | 11/1998 | Manning | 365/207 |
| 5,834,814 A | 11/1998 | Ito | 257/378 |
| 5,852,375 A | 12/1998 | Byrne et al. | 327/108 |
| 5,875,141 A * | 2/1999 | Shirley et al. | 365/207 |
| 5,883,544 A | 3/1999 | So et al. | 327/537 |
| 5,903,502 A * | 5/1999 | Porter | 365/207 |
| 5,909,400 A | 6/1999 | Bertin et al. | 365/187 |
| 5,909,618 A | 6/1999 | Forbes et al. | 438/242 |
| 5,914,511 A | 6/1999 | Noble et al. | 257/302 |
| 5,926,412 A | 7/1999 | Evans, Jr. et al. | 365/145 |
| 5,963,469 A | 10/1999 | Forbes | 365/149 |
| 5,981,995 A | 11/1999 | Selcuk | 257/330 |
| 6,040,218 A | 3/2000 | Lam | 438/259 |
| 6,072,209 A | 6/2000 | Noble et al. | 257/296 |
| 6,075,404 A | 6/2000 | Shindoh et al. | 327/537 |
| 6,100,123 A | 8/2000 | Bracchitta et al. | 438/199 |
| 6,121,084 A | 9/2000 | Coursey | 438/255 |
| 6,134,175 A | 10/2000 | Forbes et al. | 365/230.06 |
| 6,143,636 A | 11/2000 | Forbes et al. | 438/587 |
| 6,150,687 A | 11/2000 | Noble et al. | 257/302 |
| 6,153,468 A | 11/2000 | Forbes et al. | 438/257 |
| 6,156,604 A | 12/2000 | Forbes et al. | 438/241 |
| 6,156,607 A | 12/2000 | Noble et al. | 438/244 |
| 6,165,836 A | 12/2000 | Forbes et al. | 438/243 |
| 6,252,452 B1 | 6/2001 | Hatori et al. | 327/544 |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits, 27(4)*, pp. 618–624, (Apr. 1992).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and its Impact on Supply–Voltage Scaling", *Proceedings SPIE: Microelectronic Device and Multilevel Interconnection Technology, 2636*, 83–90, (1995).

Chen, M., et al., "Back–Gate Forward Bias Method for Low Voltage CMOS Digital Cicuits", *IEEE Transactions on Electron Devices, 43*, 904–909, (1996).

Chen, M.J., et al., "Back–Gate Forward Bias Method for Low–Voltage CMOS Digital Cicuits", *IEEE Transactions on Electron Devices, 43*, 904–909, (Jun. 1996).

Chen, M.J., et al., "Optimizing the Match in Weakly Inverted MOSFET's by Gated Lateral Bipolar Action", *IEEE Transactions on Electron Devices, 43*, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

Clemen, R., et al., "VT–compensated TTL–Compatible Mos Amplifier", *IBM Technical Disclosure Bulletin, 21*, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

De, V.K., et al., "Random Mosfet Parameter Fluctuation Limits to Gigascale Integration (GST)", *Symposium on VLSI Technology Digest of Technical Papers*, 198–199, (1996).

DeBar, D.E., "Dynamic Substrate Bias to Achieve Radiation Hardening", *IBM Technical Disclosure Bulletin, 25*, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters, 17(11)*, 509–511, (Nov. 1996).

Forbes, L., "Automatic On–clip Threshold Voltage Compensation", *IBM Technical Disclosure Bulletin, 14*, 2894–2895, (1972).

Frantz, H., et al., "Mosfet Substrate Bias–Voltage Generator", *IBM Technical Disclosure Bulletin, 11*, 1219–1220, (Mar. 1969).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Jung, T.S., et al., "A 117–mm2 3.3–V Only 128–Mb Multilevel NAND Flash Memory for Mass Storage Applications", *IEEE Journal of Solid–State Circuits, 31*, 1575–1583, (Nov. 1996).

Kuge, S., et al., "SOI–DRAM Circuit Technologies for Low Power High Speed Multigiga Scale Memories", *IEEE Journal of Solid–State Circuits, 31(4)*, pp. 586–591, (Apr. 1996).

Puri, Y., "Substrate Voltage Bounce in NMOS Self–biased Substrates", *IEEE Journal of Solid–State Circuits, SC–13*, 515–519, (Aug. 1978).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Sherony, M.J., et al., "Reduction of Threshold Voltage Sensitivity in SOI MOSFET's", *IEEE Electron Device Letters, 16*, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Suma, K., et al., "An SOI–DRAM with Wide Operating Voltage Range by CMOS/SIMOX Technology", *IEEE Journal of Solid–State Circuits, 29(11)*, pp. 1323–1329, (Nov. 1994).

Sun, J., "CMOS Technology for 1.8V and Beyond", *Int'l Symp. on VLSI Technology, Systems and Applications: Digest of Technical Papers*, 293–297, (1997).

Takato, H., et al., "Impact of Surrounding Gate Transistor (SGT) for Ultra–High Density LSI's", *IEEE Transactions on Electron Devices, 38*, 573–578, (Mar. 1991).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

\* cited by examiner

THRESHOLD VOLTAGE COMPENSATION CIRCUITS FOR LOW VOLTAGE AND LOW POWER CMOS INTEGRATED CIRCUITS

This application is a Divisional of U.S. application Ser. No. 09/626,214, filed Jul. 26, 2000, which is a Continuation of U.S. application Ser. No. 09/031,976, filed Feb. 26, 1998, now U.S. Pat. No. 6,097,242.

TECHNICAL FIELD OF THE INVENTION

The present invention relates generally to integrated circuitry and in particular the present invention relates to compensation circuits for transistor threshold voltages in integrated circuits.

BACKGROUND OF THE INVENTION

Transistors, such as n-channel Field Effect Transistors (FET), formed in a Complementary-Metal-Oxide-Silicon (CMOS) integrated circuit operate when an input voltage is applied to a gate electrode. This gate voltage establishes an electric field perpendicular to a channel between a source and drain of the transistor. A conductance of the channel is controlled by the electric field. If no gate voltage is applied, a path between the source and drain is formed as two back-to-back pn junctions, and a drain current ($I_D$) will be negligible. When a positive voltage is applied to the gate of the transistor, electrons are attracted to the channel. When the gate voltage exceeds a threshold level ($V_t$), an inversion layer is formed in the channel to couple the source and drain. The threshold voltage level of a transistor is dependant upon several variables, both controllable and uncontrollable.

Relatively large threshold voltage variations from 0.4 to 0.6 Volts are common in current CMOS technology. This voltage variation is not compatible with lower power supply voltages implemented as the fabrication technology is scaled down to smaller dimensions. Power supply voltages of around one volt, or less, are required in integrated circuits fabricated with 0.1 micron CMOS technology. The statistical fluctuation of dopant atom concentrations in such sub-micron fabrication can be significant and contribute to threshold voltage fluctuations.

Figure 1:
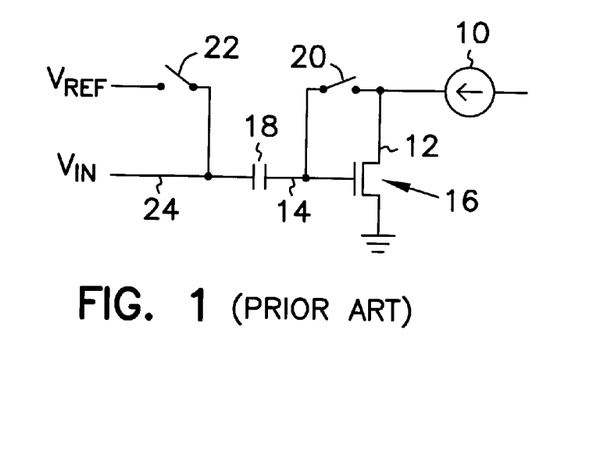
FIG. 1 is a schematic diagram of a prior art transistor threshold compensation circuit using a gate bias capacitor.

Different techniques have been described for self-compensation of threshold voltages in nMOS technology by applying a negative substrate bias. One technique, which can be applied in CMOS technology to compensate for $V_t$ fluctuation, includes a capacitor connected to the transistor gate which is charged to correct the threshold voltage variations. This circuit is illustrated in FIG. 1. A current source 10 is coupled to both the drain 12 and gate 14 (through switch 20) of the nMOSFET 16. A reference potential is coupled to the gate through a large capacitor 18 and switch 22. The capacitor is charged to a voltage required to maintain the current from the current source. This capacitor charge is retained while switches 20 and 22 are open and the transistor is connected only to the input signal at node 24. This charge must be refreshed periodically since it can leak away as leakage current in the transistor switches. Threshold voltage variations are thus compensated for by the charge temporarily stored on the capacitor. This technique is practical only for a few critical transistors in an integrated circuit because of the size of the capacitor required for each compensated transistor, such as transistors in a dynamic random access memory device (DRAM) sense amplifier. This capacitor can be implemented in DRAM technology using a stacked storage capacitor.

For the reasons stated above, and for other reasons stated below which will become apparent to those skilled in the art upon reading and understanding the present specification, there is a need in the art for a transistor threshold voltage compensation circuit for low voltage integrated circuits which is not dependant upon the provision of a gate bias capacitor.

SUMMARY OF THE INVENTION

The above mentioned problems with transistor threshold compensation circuits and other problems are addressed by the present invention and which will be understood by reading and studying the following specification. A threshold compensation circuit is described which generates a compensation voltage by regulating a backgate voltage of a transistor.

In particular, the present invention describes a threshold voltage compensation circuit for providing a compensation voltage. The compensation circuit comprises an n-channel transistor having a gate, drain and source fabricated in an isolated p-type well, a current source coupled to the drain and the p-type well, and a voltage supply for coupling the gate to a reference supply. The compensation voltage is provided at the drain for coupling to additional transistors. In an alternate embodiment, the n-channel transistor can be replaced with p-channel transistors.

In another embodiment, an integrated circuit comprises a threshold voltage compensation circuit for providing a compensation voltage. The compensation circuit comprises a first n-channel transistor having a gate, drain and source fabricated in a first isolated p-type well, a current source coupled to the drain and the p-type well, and a voltage supply for coupling the gate to a reference supply. A second n-channel transistor is fabricated in a second isolated p-type well coupled to the first isolated p-type well for receiving the compensation voltage.

An integrated circuit memory device is described which comprises an array of memory cells, control circuitry for controlling operations of the memory device, a threshold voltage compensation circuit for providing a compensation voltage, and a transistor fabricated in an isolated well coupled to receive the compensation voltage. The compensation circuit comprises a first transistor having a gate, drain and source fabricated in a first isolated well, a current source coupled to the drain and the well, and a voltage supply for coupling the gate to a reference supply.

In yet another embodiment a method of compensating for threshold voltage variations in an integrated circuit device is described. The method comprises the steps of coupling a drain and isolation well of a first transistor to a current source, coupling a gate of the first transistor to a reference voltage such that the first transistor is activated and the well is biased to a compensation voltage, and coupling the compensation voltage to a well of a second transistor.

DETAILED DESCRIPTION OF THE INVENTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
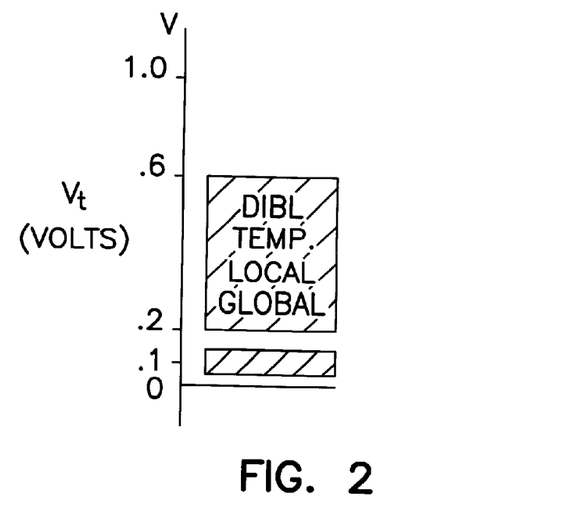
FIG. 2 illustrates a current threshold voltage range, and a desired range.

The present invention describes a circuit for compensation of CMOS threshold voltages when low power supplies such as 1 V, ½V, or lower are utilized to reduce power dissipation. While the present invention is applicable at any power supply level, it is most useful at power supply levels below three volts. FIG. 2 illustrates variations in threshold voltage which can occur as a consequence of normal process variations and use conditions including local fabrication variations on a wafer, global fabrication variations from wafer lot to wafer lot, differences due to drain-induced barrier lowering (DIBL) and variations due to operating temperature. It is reasonable to expect a 0.4 V variation in threshold voltages. These variations must be accounted for in designs and can result in large variations in circuit speed and even create malfunctions. The desired threshold value (0.1 V) and range of variations (0.1 V) which would be ideal for a 0.5 V power supply CMOS logic technology is also illustrated in FIG. 2.

Figure 3:
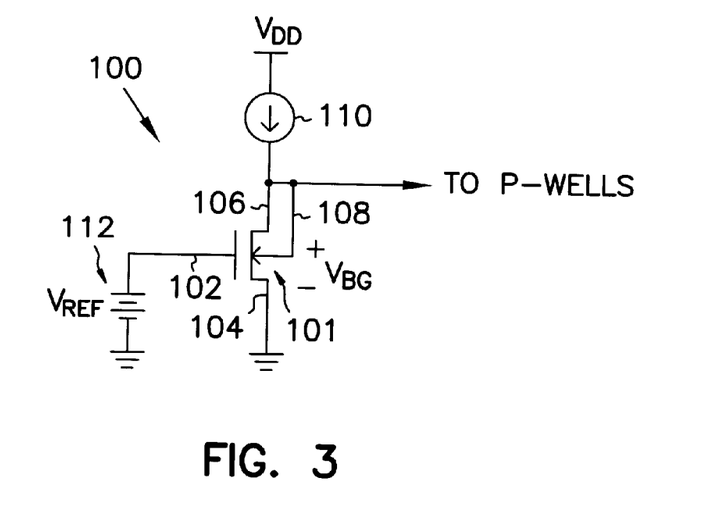
FIG. 3 is a schematic diagram of one transistor threshold compensation circuit of the present invention.
Figure 4:
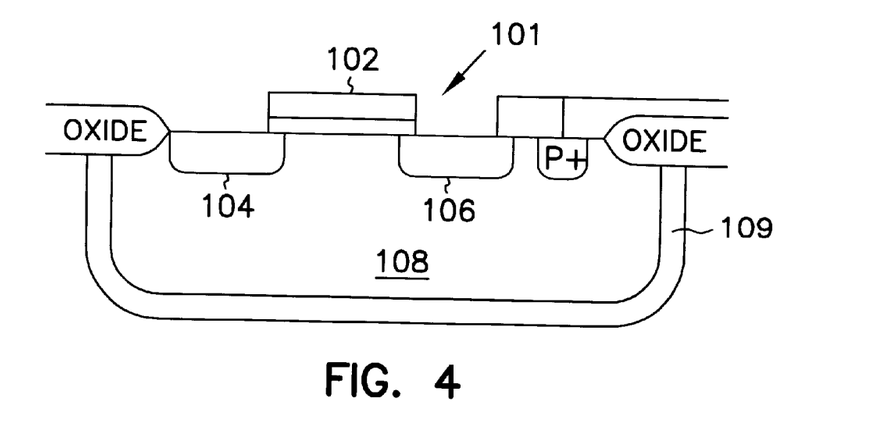
FIG. 4 is a cross-section of an integrated circuit transistor of FIG. 3.

FIG. 3 illustrates one embodiment of a compensation circuit 100 of the present invention. An n-channel transistor 101 is provided which has a gate 102, source 104, and a drain 106. A cross section of the transistor as fabricated in an integrated circuit is illustrated in FIG. 4. The transistor is formed in a p-well 108 which is isolated from the integrated circuit substrate via an n-type isolation region 109. The gate 102 of the transistor is driven at a reference potential, $V_{REF}$, by supply 112. Both the drain 106 and transistor well 108, or backgate, are connected to a current source 110. $V_{REF}$ is some value larger than the threshold voltage, $V_t$, which is desired for optimum circuit functionality and performance. It will be appreciated that different $V_t$ levels may be desired for different circuits on a common integrated circuit die. Any known current source can be used as current source 110.

Figure 5:
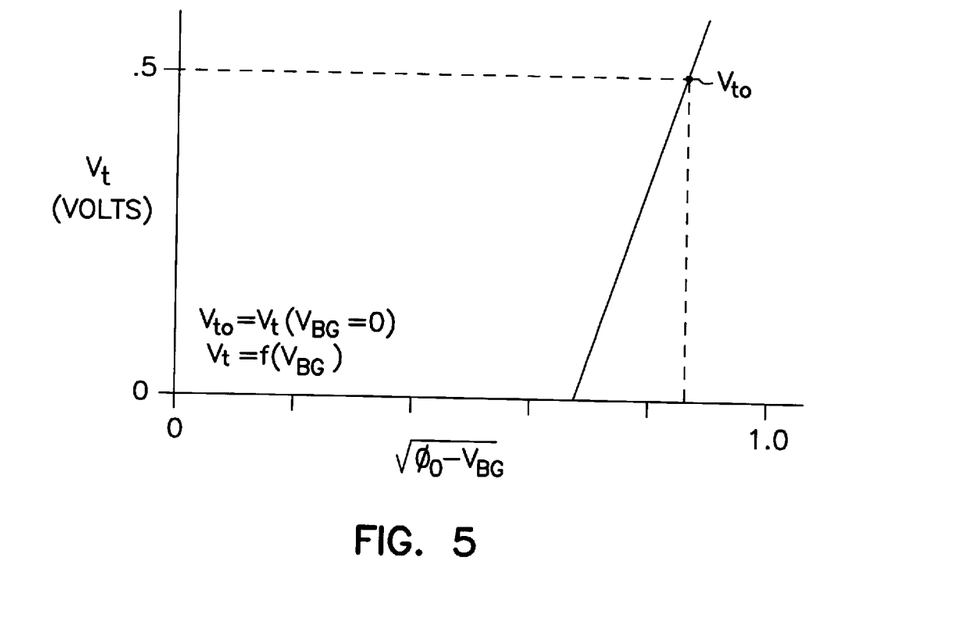
FIG. 5 is a graph illustrating a relationship between a threshold voltage and backgate voltage.
Figure 6:
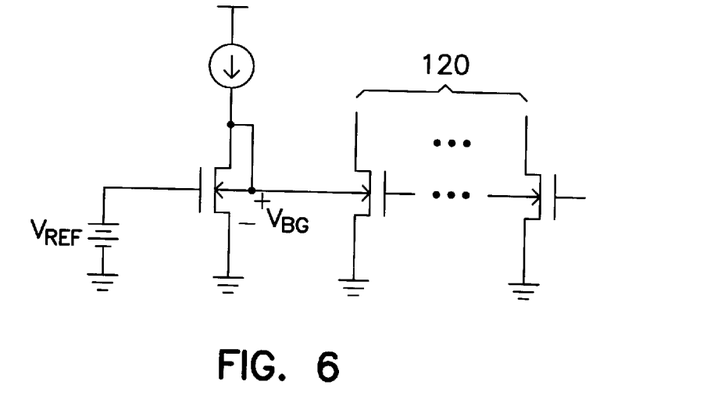
FIG. 6 is a schematic diagram of the transistor threshold compensation circuit of FIG. 3 coupled to transistor provided on the same integrated circuit.

As a consequence of the current source 110 forcing current into the drain, the backgate becomes forward biased and adjusts the backgate bias voltage, $V_{BG}$. The backgate bias voltage is adjusted to a value which provides a threshold voltage value required to support the drain current. The threshold voltage will be less than the reference potential $V_{REF}$ and the transistor will turn on. As shown in FIG. 5, the threshold voltage, $V_1$, decreases as the backgate or substrate becomes forward biased. $V_{t0}$ is the original variable threshold voltage of the transistor with no well bias. The backgate bias voltage, $V_{BG}$, established by the compensation circuit 100 is coupled to a p-well or substrate contact of transistors 120 provided on the integrated circuit which are desired to have a regulated threshold voltage, see FIG. 6.

Figure 7:
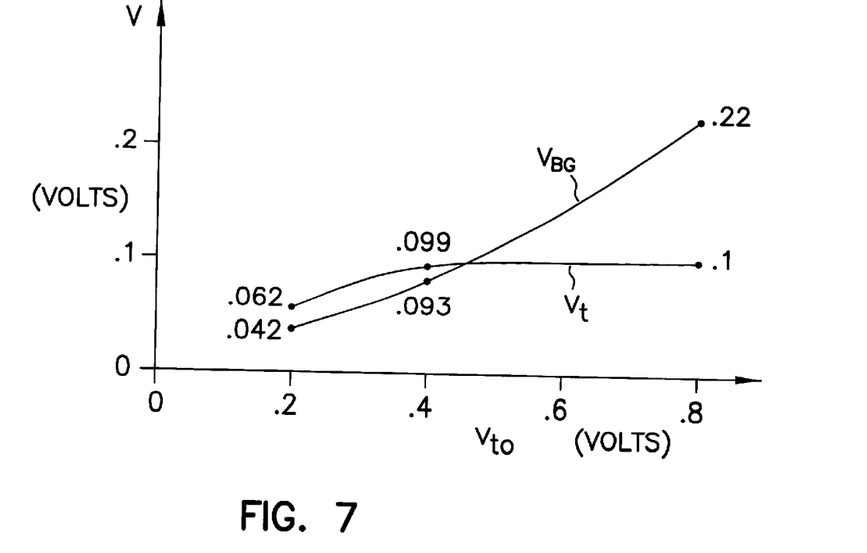
FIG. 7 is a graph of $V_{BG}$ verses $V_t$.

FIG. 7 illustrates the results of a circuit simulation using the commonly available and well-known circuit simulation program SPICE. An original threshold voltage, $V_{t0}$, distribution from 0.2 to 0.8 Volts results in a variation of the backgate voltage from 0.042 to 0.22 Volts. This backgate voltage variation changes the threshold voltage, $V_t$, of the transistor from 0.06 to 0.1 Volts. In other words, the original threshold voltage, $V_{t0}$, variation of 0.6 V=0.8 V-0.2 V was changed to an effective threshold voltage, $V_t$, variation of 0.04 V=0.1 V-0.06 V. Thus, a 600 mV variation was compensated for and reduced to a 40 mV variation. As stated above, the variable backgate voltage, $V_{BG}$, is applied to the p-wells or p-type substrate of other nMOSFET transistors on the same integrated circuit die. In fact, if a CMOS SOI or bulk CMOS p-well technology is used, the wells of different circuitry on the die might be driven with different backgate biases for different applications.

Figure 8:
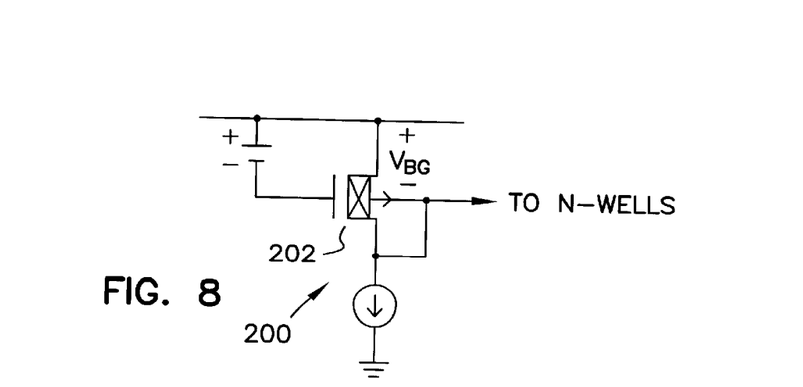
FIG. 8 is a schematic diagram of another transistor threshold compensation circuit of the present invention.

Although the above described circuit uses an n-channel transistor 101, the present invention is not limited to this embodiment. FIG. 8 illustrates another embodiment of a compensation circuit 200 of the present invention using a p-channel transistor 202. This embodiment provides a variable backgate bias which can be applied to transistor n-wells in a p-type wafer technology, or to a substrate in a n-type wafer technology.

Figure 9:
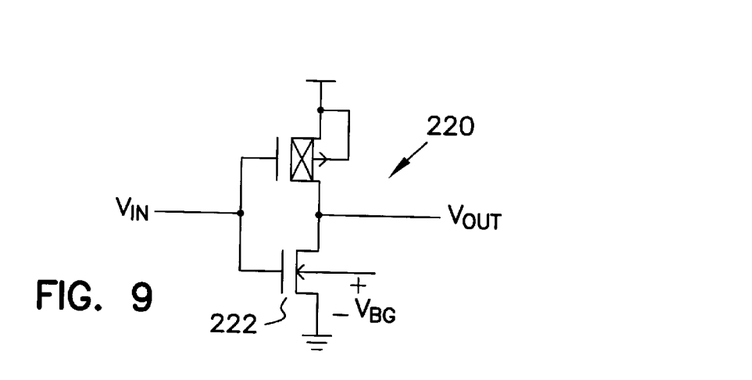
FIG. 9 is a schematic diagram of an inverter circuit having a compensated threshold voltage.

The present invention can be applied to numerous circuits where performance is dependant upon a threshold voltage level. One such circuit is an inverter. FIG. 9 illustrates a CMOS inverter 220 where the backgate bias, or substrate voltage, of an n-channel MOSFET 222 is adjusted to compensate for threshold voltage variations due to fabrication and other variables. The technique is not restricted to inverters but is also applicable to other logic gates and CMOS circuits. For example, the threshold compensation circuits described above can be provided on an integrated circuit memory device.

Figure 10:
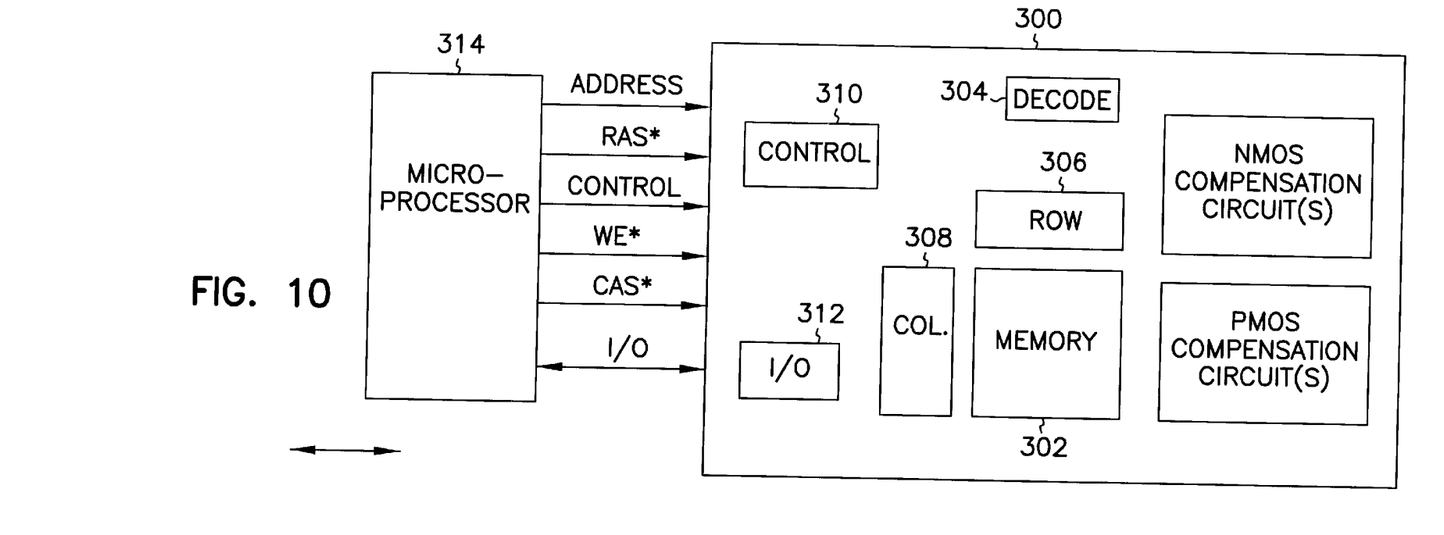
FIG. 10 is a block diagram of a memory device incorporating a transistor threshold compensation circuit.

FIG. 10 is a simplified block diagram of a memory device according to one embodiment of the present invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, write enable, RAS*, row address strobe, and CAS*, column address strobe, signals. The memory is used to store data which is accessed via I/O lines. It will be appreciated by those skilled in the art that additional circuitry and control signals can be provided, and that the memory device of FIG. 10 has been simplified to help focus on the present invention.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Figure 11:
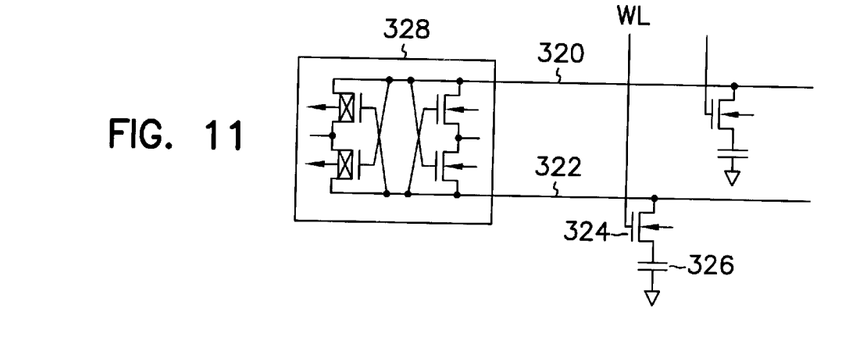
FIG. 11 illustrates a portion of the circuitry of FIG. 10.

Referring to FIG. 11, a portion of the memory device of FIG. 10 is further described. The simplified schematic diagram illustrates a column of the memory array 302. The column is generally defined by a pair of digit lines 320 and 322. Access transistors 324 are located along the digit lines for coupling memory cells 326 to a digit line. The access transistors are activated by a word line (WL), which defines a row of the memory array. A differential amplifier circuit 328 is provided to detect and amplify signals provided on the digit lines. The threshold voltages of the transistors for the sense amplifier circuitry can be controlled, as described herein, to adjust the sensitivity of the sense amplifier. For access transistors 324 in a DRAM memory circuit, a larger $V_t$, value may be desired to reduce memory cell leakage. If a threshold voltage is too low, the word line voltage may need to be driven to a negative level at standby to reduce leakage current and increase retention time in the memory cells.

CONCLUSION

A compensation circuit for transistor threshold voltages in integrated circuits has been described. The compensation circuit includes a transistor, current source, and gate reference voltage supply. The transistor is biased to provide a well bias voltage, or backgate voltage $V_{BG}$, which can be coupled to transistors provided on an integrated circuit. This compensation circuit eliminates the need for gate biasing capacitors, and provides flexibility in setting threshold voltages in low voltage circuits. The gate reference voltage and current source are established to provide a desired backgate voltage $V_{BG}$. Compensation circuits are described for both n-channel and p-channel transistors. A memory device is described which includes compensation circuits for controlling threshold voltages of transistors provided therein.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
    a plurality of memory cells, each memory cell including a differential amplifier circuit having a sensitivity to detect and amplify signals provided on complementary digit lines, wherein the differential amplifier circuit includes at least one target transistor having a backgate; and
    a compensation circuit adapted to control a threshold voltage of the at least one target transistor in the differential amplifier circuit to adjust the sensitivity of the differential amplifier circuit, wherein the compensation circuit includes:
        a compensation transistor having a gate, a source, a drain, and a backgate coupled to the drain and to the backgate of the at least one target transistor to regulate the threshold voltage of the at least one target transistor;
        a reference voltage supply coupled to the gate; and
        a constant current source coupled to the drain and adapted to force current through the compensation transistor to adjust a backgate bias voltage that provides a threshold voltage for the compensation transistor required to support a drain current in the compensation transistor.

2. The memory device of claim 1, wherein:
    the compensation transistor is an NMOS compensation transistor; and
    the constant current source forces current into the drain of the NMOS compensation transistor.

3. The memory device of claim 1, wherein:
    the compensation transistor is a PMOS compensation transistor; and
    the constant current source forces current out of the drain of the PMOS compensation transistor.

4. A memory device, comprising:
    a plurality of memory cells, each memory cell including a differential amplifier circuit having a sensitivity to detect and amplify signals provided on complementary digit lines, wherein the differential amplifier circuit includes at least one NMOS target transistor having a backgate; and
    an NMOS compensation circuit adapted to control a threshold voltage of the at least one NMOS target transistor in the differential amplifier circuit to adjust the sensitivity of the differential amplifier circuit, wherein the NMOS compensation circuit includes:
        an NMOS compensation transistor having a gate, a source, a drain, and a backgate coupled to the drain and to the backgate of the at least one NMOS target transistor to regulate the threshold voltage of the at least one NMOS target transistor;
        a reference voltage supply coupled to the gate; and
        a constant current source coupled to the drain and adapted to force current into the drain of the NMOS compensation transistor to adjust a backgate bias voltage that provides a threshold voltage for the NMOS compensation transistor required to support a drain current in the NMOS compensation transistor.

5. The memory device of claim 4, wherein the drain of the NMOS compensation transistor is coupled to a p-well of the at least one NMOS target transistor in n-type wafer technology to regulate a threshold voltage of the at least one NMOS target transistor.

6. The memory device of claim 4, wherein the drain of the NMOS compensation transistor is coupled to a substrate of the at least one NMOS target transistor in p-type wafer technology to regulate a threshold voltage of the at least one NMOS target transistor.

7. A memory device, comprising:
    a plurality of memory cells, each memory cell including a differential amplifier circuit having a sensitivity to detect and amplify signals provided on complementary digit lines, wherein the differential amplifier circuit includes at least one PMOS target transistor having a backgate; and a PMOS compensation circuit adapted to control a threshold voltage of the at least one PMOS target transistor in the differential amplifier circuit to adjust the sensitivity of the differential amplifier circuit, wherein the PMOS compensation circuit includes:

a PMOS compensation transistor having a gate, a source, a drain, and a backgate coupled to the drain and to the backgate of the at least one PMOS target transistor to regulate the threshold voltage of the at least one PMOS target transistor;

a reference voltage supply coupled to the gate; and a constant current source coupled to the drain and adapted to force current out of the drain of the PMOS compensation transistor to adjust a backgate bias voltage that provides a threshold voltage for the PMOS compensation transistor required to support a drain current in the PMOS compensation transistor.

8. The memory device of claim 7, wherein the drain of the PMOS compensation transistor is coupled to an n-well of the at least one PMOS target transistor in p-type wafer technology to regulate a threshold voltage of the at least one PMOS target transistor.

9. The memory device of claim 7, wherein the drain of the PMOS compensation transistor is coupled to a substrate of the at least one PMOS target transistor in n-type wafer technology to regulate a threshold voltage of the at least one PMOS target transistor.

10. A memory device, comprising:

a plurality of memory cells, each memory cell including a differential amplifier circuit having a sensitivity to detect and amplify signals provided on complementary digit lines, wherein the differential amplifier circuit includes at least one NMOS target transistor having a backgate and at least one PMOS target transistor having a backgate;

an NMOS compensation circuit adapted to control a threshold voltage of the at least one NMOS target transistor in the differential amplifier circuit to adjust the sensitivity of the differential amplifier circuit, wherein the NMOS compensation circuit includes:

an NMOS compensation transistor having a gate, a source, a drain, and a backgate coupled to the drain and to the backgate of the at least one NMOS target transistor to regulate the threshold voltage of the at least one NMOS target transistor;

a reference voltage supply coupled to the gate; and a constant current source coupled to the drain and adapted to force current into the drain of the NMOS compensation transistor to adjust a backgate bias voltage that provides a threshold voltage for the NMOS compensation transistor required to support a drain current in the NMOS compensation transistor; and a PMOS compensation circuit adapted to control a threshold voltage of the at least one PMOS target transistor in the differential amplifier circuit to adjust a sensitivity of the differential amplifier circuit, wherein the PMOS compensation circuit includes:

a PMOS compensation transistor having a gate, a source, a drain, and a backgate coupled to the drain to the backgate of the at least one PMOS target transistor to regulate the threshold voltage of the at least one PMOS target transistor;

a reference voltage supply coupled to the gate; and a constant current source coupled to the drain and adapted to force current out of the drain of the PMOS compensation transistor to adjust a backgate bias voltage that provides a threshold voltage for the PMOS compensation transistor required to support a drain current in the PMOS compensation transistor.

11. The memory device of claim 10, wherein the drain of the NMOS compensation transistor is coupled to a p-well of the at least one NMOS target transistor in n-type wafer technology to regulate the threshold voltage of the at least one NMOS target transistor.

12. The memory device of claim 10, wherein the drain of the NMOS compensation transistor is coupled to a substrate of the at least one NMOS target transistor in p-type wafer technology to regulate the threshold voltage of the at least one NMOS target transistor.

13. The memory device of claim 10, wherein the drain of the PMOS compensation transistor is coupled to an n-well of the at least one PMOS target transistor in p-type wafer technology to regulate the threshold voltage of the at least one PMOS target transistor.

14. The memory device of claim 10, wherein the drain of the PMOS compensation transistor is coupled to a substrate of the at least one PMOS target transistor in n-type wafer technology to regulate the threshold voltage of the at least one PMOS target transistor.

15. A memory device, comprising:

a plurality of memory cells, each memory cell including a differential amplifier circuit having a sensitivity to detect and amplify signals provided on complementary digit lines, wherein the differential amplifier circuit includes:

a first PMOS transistor having a gate, a source and a drain;

a second PMOS transistor having a gate, a source and a drain;

a first NMOS transistor having a gate, a source and a drain;

a second NMOS transistor having a gate, a source and a drain;

wherein the drain of the first PMOS transistor is coupled to the drain of the first NMOS transistor, wherein the drain of the second PMOS transistor is coupled to the drain of the second NMOS transistor, wherein the drain of the first PMOS transistor and the drain of the first NMOS transistor are coupled to the gate of the second PMOS transistor and the gate of the second NMOS transistor, wherein the drain of the second PMOS transistor and the drain of the second NMOS transistor are coupled to the gate of the first PMOS transistor and the gate of the first NMOS transistor, wherein a first of two complementary digit lines is coupled to the drain of the first PMOS transistor and to the drain of the first NMOS transistor, and wherein a second of two complementary digit lines is coupled to the drain of the second PMOS transistor and to the drain of the second NMOS transistor;

an NMOS compensation circuit adapted to control a threshold voltage of the first and second NMOS transistors in the differential amplifier circuit to adjust the sensitivity of the differential amplifier circuit, wherein the NMOS compensation circuit includes:

an NMOS compensation transistor having a gate, a source, a drain, and a backgate coupled to the drain and to a backgate of the first NMOS transistor and a backgate of the second NMOS transistor;

a reference voltage supply coupled to the gate; and a constant current source coupled to the drain and adapted to force current into the drain of the NMOS compensation transistor to adjust a backgate bias voltage that provides a threshold voltage for the NMOS compensation transistor required to support a drain current in the NMOS compensation transistor; and a PMOS compensation circuit adapted to control a threshold voltage of the first and second PMOS transistors in the differential amplifier circuit to adjust the sensitivity of the differential amplifier circuit, wherein the PMOS compensation circuit includes:

a PMOS compensation transistor having a gate, a source, a drain, and a backgate coupled to the drain and to a backgate of the first PMOS transistor and a backgate of the second PMOS transistor;

a reference voltage supply coupled to the gate; and a constant current source coupled to the drain and adapted to force current out of the drain of the PMOS compensation transistor to adjust a backgate bias voltage that provides a threshold voltage for the PMOS compensation transistor required to support a drain current in the PMOS compensation transistor.

16. The memory device of claim 15, wherein in n-type wafer technology, the drain of the NMOS compensation transistor is coupled to a p-well of the at least one NMOS target transistor to regulate the threshold voltage of the at least one NMOS target transistor, and the drain of the PMOS compensation transistor is coupled to a substrate of the at least one PMOS target transistor to regulate the threshold voltage of the at least one PMOS target transistor.

17. The memory device of claim 15, wherein in p-type wafer technology, the drain of the NMOS compensation transistor is coupled to a substrate of the at least one NMOS target transistor to regulate the threshold voltage of the at least one NMOS target transistor, and the drain of the PMOS compensation transistor is coupled to an n-well of the at least one PMOS target transistor to regulate the threshold voltage of the at least one PMOS target transistor.

18. An electronic system, comprising:

a processor; and a memory device operably coupled to the processor, wherein the memory device includes:

a plurality of memory cells;

a plurality of differential amplifier circuits having a sensitivity to detect and amplify signals provided on complementary digit lines, wherein the plurality of differential amplifier circuits includes at least one target transistor having a backgate; and a compensation circuit adapted to control a threshold voltage of the at least one target transistor in the differential amplifier circuit to adjust the sensitivity of the differential amplifier circuit, wherein the compensation circuit includes:

a compensation transistor having a gate, a source, a drain, and a backgate coupled to the drain and to the backgate of the at least one target transistor to regulate the threshold voltage of the at least one target transistor;

a reference voltage supply coupled to the gate; and a constant current source coupled to the drain and adapted to force current through the compensation transistor to adjust a backgate bias voltage that provides a threshold voltage for the compensation transistor required to support a drain current in the compensation transistor.

19. The electronic system of claim 18, wherein:

the at least one target transistor includes at least one NIVIOS target transistor;

the compensation transistor is an NMOS compensation transistor; and the constant current source forces current into the drain of the NMOS compensation transistor.

20. The electronic system of claim 18, wherein:

the at least one target transistor includes at least one PMOS target transistor;

the compensation transistor is a PMOS compensation transistor; and the constant current source forces current out of the drain of the PMOS compensation transistor.

21. The electronic system of claim 18, wherein the memory device further includes:

an address decoder coupled to the plurality of memory cells and adapted for decoding addresses used to access the plurality of memory cells;

row access circuitry coupled to the plurality of memory cells and adapted for accessing rows of memory cells;

column access circuitry coupled to the plurality of memory cells and adapted for accessing columns of memory cells;

control circuitry coupled to the plurality of memory cells and adapted for controlling read and write operations of the memory cell; and input and output circuitry coupled to the plurality of memory cells and adapted for reading from and writing to the plurality of memory cells.

22. The electronic system of claim 18, wherein the memory device is a DRAM device, and wherein the memory device further includes a plurality of access transistors and an access transistor compensation circuit adapted to provide a larger threshold voltage for the access transistors to reduce memory cell leakage, wherein the access transistor compensation circuit includes:

an access compensation transistor having a gate, a source, a drain, and a backgate coupled to the drain and to a backgate of at least one of the plurality of access transistors;

an access reference voltage supply coupled to the gate of the access compensation transistor; and an access constant current source coupled to the drain of the access compensation transistor and adapted to force current through the access compensation transistor to adjust a backgate bias voltage that provides a threshold voltage for the access compensation transistor required to support a drain current in the access compensation transistor.

23. An electronic system, comprising:

a processor; and a memory device operably coupled to the processor, wherein the memory device includes:

a plurality of memory cells;

a plurality of differential amplifier circuits having a sensitivity to detect and amplify signals provided on complementary digit lines, wherein each of the plurality of differential amplifier circuits includes at least one NMOS target transistor having a backgate; and an NMOS compensation circuit adapted to control a threshold voltage of the at least one NMOS target transistor in the differential amplifier circuit to adjust the sensitivity of the differential amplifier circuit, wherein the NMOS compensation circuit includes:

an NMOS compensation transistor having a gate, a source, a drain, and a backgate coupled to the drain and to the backgate of the at least one NMOS target transistor to regulate the threshold voltage of the at least one NMOS target transistor;

a reference voltage supply coupled to the gate of the NMOS compensation transistor; and a constant current source coupled to and adapted to force current into the drain of the NMOS compensation transistor to adjust a backgate bias voltage that provides a threshold voltage for the NMOS compensation transistor required to support a drain current in the at least one NMOS compensation transistor.

24. The electronic system of claim 23, wherein the drain of the NMOS compensation transistor is coupled to a p-well of the at least one NMOS target transistor in n-type wafer technology to regulate the threshold voltage of the at least one NMOS target transistor.

25. The electronic system of claim 23, wherein the drain of the NMOS compensation transistor is coupled to a substrate of the at least one NMOS target transistor in p-type wafer technology to regulate the threshold voltage of the at least one NMOS target transistor.

26. An electronic system, comprising:
a processor; and
a memory device operably coupled to the processor, wherein the memory device includes:
a plurality of memory cells;
a plurality of differential amplifier circuits having a sensitivity to detect and amplify signals provided on complementary digit lines, wherein each of the plurality of differential amplifier circuits includes at least one PMOS target transistor having a backgate; and
a PMOS compensation circuit adapted to control a threshold voltage of at least one PMOS target transistor in the differential amplifier circuit to adjust the sensitivity of the differential amplifier circuit, wherein the PMOS compensation circuit includes:
a PMOS compensation transistor having a gate, a source, a drain, and a backgate coupled to the drain and to the backgate of the at least one PMOS target transistor to regulate the threshold voltage of the at least one PMOS target transistor;
a reference voltage supply coupled to the gate of the PMOS compensation transistor; and
a constant current source coupled to and adapted to force current out of the drain of the PMOS compensation transistor to adjust a backgate bias voltage that provides a threshold voltage for the PMOS compensation transistor required to support a drain current in the at least one PMOS compensation transistor.

27. The electronic system of claim 26, wherein the drain of the PMOS compensation transistor is coupled to an n-well of the at least one PMOS target transistor in p-type wafer technology to regulate the threshold voltage of the at least one PMOS target transistor.

28. The electronic system of claim 26, wherein the drain of the PMOS compensation transistor is coupled to a substrate of the at least one PMOS target transistor in n-type wafer technology to regulate the threshold voltage of the at least one PMOS target transistor.

29. An electronic system, comprising:
a processor; and
a memory device operably coupled to the processor, wherein the memory device includes:
a plurality of memory cells;
a plurality of differential amplifier circuits having a sensitivity to detect and amplify signals provided on complementary digit lines, wherein the plurality of differential amplifier circuits includes at least one NMOS target transistor having a backgate and at least one PMOS target transistor having a backgate;
an NMOS compensation circuit adapted to control a threshold voltage of the at least one NMOS target transistor in the differential amplifier circuit to adjust the sensitivity of the differential amplifier circuit, wherein the NMOS compensation circuit includes:
an NMOS compensation transistor having a gate, a source, a drain, and a backgate coupled to the drain and to the backgate of the at least one NMOS target transistor to regulate the threshold voltage of the at least one NMOS target transistor;
a reference voltage supply coupled to the gate of the NMOS compensation transistor; and
a constant current source coupled to and adapted to force current into the drain of the NMOS compensation transistor to adjust a backgate bias voltage that provides a threshold voltage for the NMOS compensation transistor required to support a drain current in the at least one NMOS compensation transistor; and
a PMOS compensation circuit adapted to control a threshold voltage of at least one PMOS target transistor in the differential amplifier circuit to adjust a sensitivity of the differential amplifier circuit, wherein the PMOS compensation circuit includes:
a PMOS compensation transistor having a gate, a source, a drain, and a backgate coupled to the drain and to the backgate of the at least one PMOS target transistor to regulate the threshold voltage of the at least one PMOS target transistor;
a reference voltage supply coupled to the gate of the PMOS compensation transistor; and
a constant current source coupled to and adapted to force current into the drain of the PMOS compensation transistor to adjust a backgate bias voltage that provides a threshold voltage for the PMOS compensation transistor required to support a drain current in the at least one PMOS compensation transistor.

30. The electronic system of claim 29, wherein the drain of the NMOS compensation transistor is coupled to a p-well of the at least one NMOS target transistor in n-type wafer technology to regulate the threshold voltage of the at least one NMOS target transistor.

31. The electronic system of claim 29, wherein the drain of the NMOS compensation transistor is coupled to a substrate of the at least one NMOS target transistor in p-type wafer technology to regulate the threshold voltage of the at least one NMOS target transistor.

32. The electronic system of claim 29, wherein the drain of the PMOS compensation transistor is coupled to an n-well of the at least one PMOS target transistor in p-type wafer technology to regulate the threshold voltage of the at least one PMOS target transistor.

33. The electronic system of claim 29, wherein the drain of the PMOS compensation transistor is coupled to a substrate of the at least one PMOS target transistor in n-type wafer technology to regulate the threshold voltage of the at least one PMOS target transistor.

34. An electronic system, comprising:
a processor; and
a memory device operably coupled to the processor, wherein the memory device includes:

a plurality of DRAM cells, each DRAM cell including an access transistor coupled to a capacitor, each DRAM cell being coupled to complementary digit lines; and an access transistor compensation circuit adapted to provide a larger threshold voltage for the access transistor of each DRAM cell to reduce memory cell leakage, wherein the access transistor compensation circuit includes:

an access compensation transistor having a gate, a source, a drain, and a backgate coupled to the drain and to a backgate of the access transistor to regulate a threshold voltage of the access transistor;

an access reference voltage supply coupled to the gate; and an access constant current source coupled to the drain and adapted to force current through the compensation transistor to adjust a backgate bias voltage for the compensation transistor that provides a threshold voltage required to support a drain current in the compensation transistor.

35. The electronic system of claim 34, wherein:

the access transistor includes an NMOS access transistor;

the access compensation transistor is an NMOS compensation transistor; and the access constant current source forces current into the drain of the NMOS compensation transistor.

36. The electronic system of claim 34, wherein:

the access transistor includes a PMOS access transistor;

the access compensation transistor is a PMOS compensation transistor; and the access constant current source forces current out of the drain of the PMOS compensation transistor.

37. An electronic system, comprising:

a processor; and a memory device operably coupled to the processor, wherein the memory device includes:

a plurality of DRAM cells, each DRAM cell including an access transistor coupled to a capacitor, each access transistor having a backgate, each DRAM cell being coupled to complementary digit lines;

a plurality of differential amplifier circuits having a sensitivity to detect and amplify signals provided on the complementary digit lines, wherein the plurality of differential amplifier circuits include at least one target transistor having a backgate;

at least one differential amplifier compensation circuit adapted to control a threshold voltage of the at least one target transistor in the plurality of differential amplifier circuits to adjust the sensitivity of the differential amplifier circuits, wherein the differential amplifier compensation circuit includes:

a differential amplifier compensation transistor having a gate, a source, a drain, and a backgate coupled to the drain and to the backgate of the at least one target transistor;

a differential amplifier reference voltage supply coupled to the gate; and a differential amplifier constant current source coupled to the drain and adapted to force current through the compensation transistor to adjust a backgate bias voltage for the compensation transistor that provides a threshold voltage required to support a drain current in the compensation transistor; and an access compensation circuit adapted to provide a larger threshold voltage for the access transistors of each DRAM cell to reduce memory cell leakage, wherein the access transistor compensation circuit includes:

an access compensation transistor having a gate, a source, a drain, and a backgate coupled to the drain and to the backgate of the access transistor, wherein the drain of the access compensation transistor is coupled to a backgate of the access transistor to regulate a threshold voltage of the access transistor;

an access reference voltage supply coupled to the gate; and an access constant current source coupled to the drain and adapted to force current through the compensation transistor to adjust a backgate bias voltage for the compensation transistor that provides a threshold voltage required to support a drain current in the compensation transistor.

38. The electronic system of claim 37, wherein:

the at least one target transistor includes at least one NMOS target transistor;

the differential amplifier compensation transistor is an NMOS compensation transistor; and the differential amplifier constant current source forces current into the drain of the NMOS compensation transistor.

39. The electronic system of claim 37, wherein:

the at least one target transistor includes at least one PMOS target transistor;

the differential amplifier compensation transistor is a PMOS compensation transistor; and the differential amplifier constant current source forces current out of the drain of the PMOS compensation transistor.

40. The electronic system of claim 37, wherein:

the access transistor includes an NlMOS access transistor;

the access compensation transistor is an NMOS compensation transistor; and the access constant current source forces current into the drain of the NMOS compensation transistor.

41. The electronic system of claim 37, wherein:

the access transistor includes a PMOS access transistor;

the access compensation transistor is a PMOS compensation transistor; and the access constant current source forces current out of the drain of the PMOS compensation transistor.

* * * * *

UNITED STATES PATENT AND TRADEMARK OFFICE
CERTIFICATE OF CORRECTION

PATENT NO. : 6,674,672 B2
DATED : January 6, 2004
INVENTOR(S) : Forbes et al.

It is certified that error appears in the above-identified patent and that said Letters Patent is hereby corrected as shown below:

Title page,
Item [56], Referneces Cited, U.S. PATENT DOCUMENTS, delete "7/1993' and insert -- 1/1993 --, therefor.
FOREIGN PATENT DOCUMENTS, delete "522661" and insert -- 5226661 --, therefor.

Column 4,
Line 15, delete "$V_1$" and insert -- $V_t$ --, therefor.

Column 14,
Line 48, delete "NIMOS" and insert -- NMOS --, therefor.

Signed and Sealed this

Twentieth Day of April, 2004

JON W. DUDAS
*Acting Director of the United States Patent and Trademark Office*